United States Patent [19]
Taylor

[11] 4,125,880
[45] Nov. 14, 1978

[54] SIMPLIFIED OUTPUT CIRCUIT FOR READ ONLY MEMORIES

[75] Inventor: David L. Taylor, Satellite Beach, Fla.

[73] Assignee: Harris Corporation, Cleveland, Ohio

[21] Appl. No.: 776,070

[22] Filed: Mar. 9, 1977

[51] Int. Cl.² .................. G11C 17/00; G11C 7/00
[52] U.S. Cl. .................................. 365/242; 365/96
[58] Field of Search ....... 340/173 SP, 173 R, 174 CS, 340/174 LA; 307/238, 317 A, 317 R, 31, 32; 365/242, 243, 94, 96, 189

[56] References Cited

U.S. PATENT DOCUMENTS

| 3,872,450 | 3/1975 | Reynolds | 365/96 |
| 4,014,007 | 3/1977 | Groeger | 340/173 SP |
| 4,014,008 | 3/1977 | Groeger et al. | 340/173 SP |
| 4,037,218 | 7/1977 | Groeger et al. | 340/173 SP |

Primary Examiner—Bernard Konick
Assistant Examiner—Donald McElheny
Attorney, Agent, or Firm—Leitner, Palan, Martin & Bernstein

[57] ABSTRACT

An output circuit having an output switch controlled by a current steering means which steers the emitter current from the selected memory storage location to the output switch as a function of magnitude to provide an appropriate logic voltage output. An enable switch interconnects the storage matrix and the output circuit.

A fusing circuit includes a current sink connected in parallel with the output circuit for developing sufficient current through a selected storage location whenever a voltage is applied at the output and the operating voltage for the memory storage matrix is raised.

20 Claims, 1 Drawing Figure

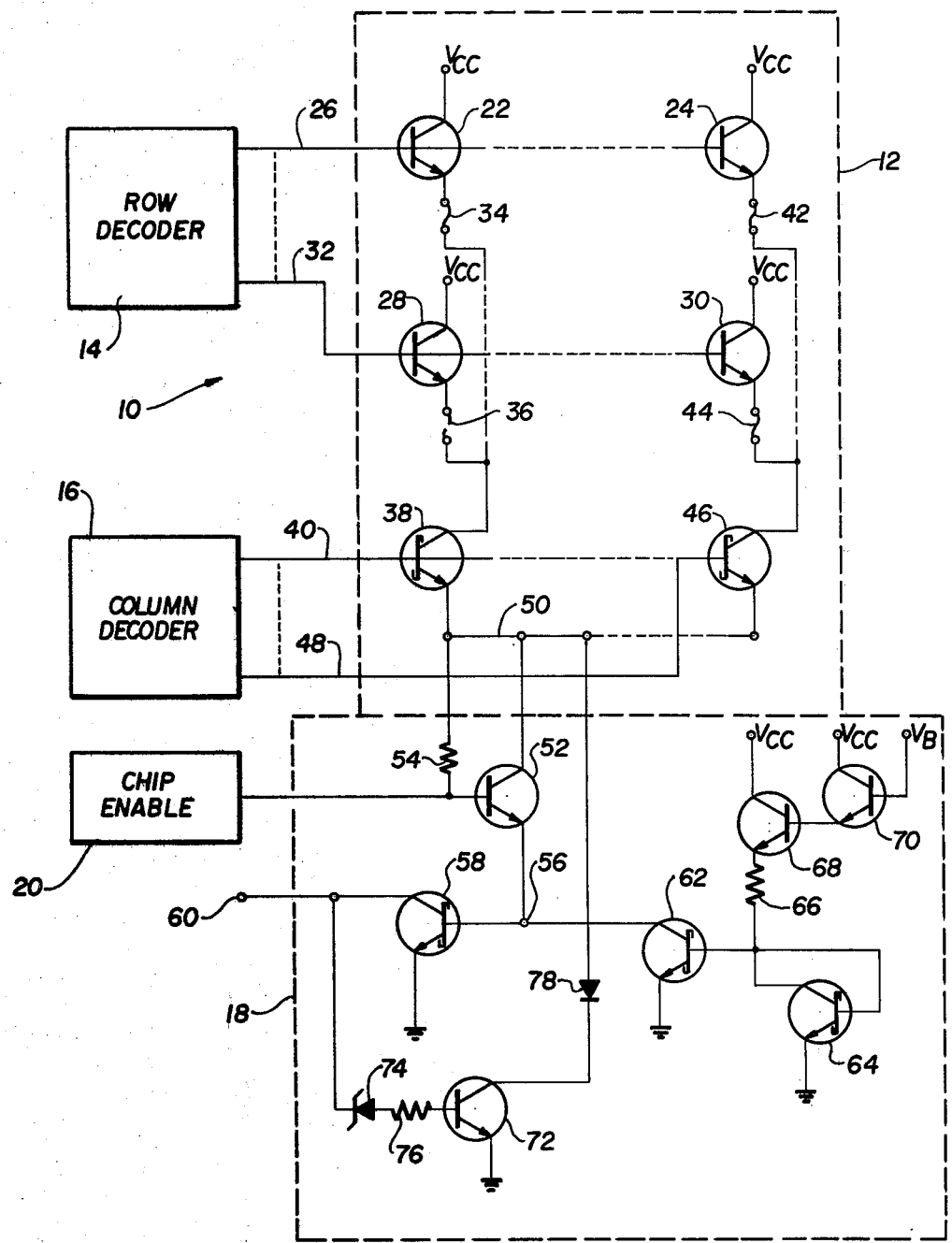

SIMPLIFIED OUTPUT CIRCUIT FOR READ ONLY MEMORIES

BACKGROUND OF THE INVENTION

1. Field of the Invention

The present invention relates generally to read only memories and more particularly to a simplified output circuit arrangement for read only memories and programmable read only memories.

2. Description of the Prior Art

In the field of read only memories (ROM) and programmable read only memories (PROM) the output circuit generally includes sequentially a sense amplifier and an output buffer. Typically, the sense amplifier detects a voltage level from a memory storage matrix. The detected level is then processed through an output buffer to provide an output drive which is compatible with TTL (Transistor to Transistor Logic) loading requirements. The use of voltage sensing schemes and output buffers increases the power dissipation and surface area on the semiconductor memory chip. Similarly, these additional circuit elements of the sensing amplifier and output buffer increase the overall response time of the read only memory.

Thus, there exists a need for an output scheme for read only and programmable read only memories which minimizes power dissipation, response time and surface area requirements in integrated circuits.

Fuse selection and programming circuits for programmable read only memories of the prior art have generally involved additional circuitry to select the location of the fuse to be blown. A voltage is applied to the generally grounded fuse element and a large voltage is applied across and large current is driven through the storage matrix to blow the fuse. Thus an unreasonable amount of additional circuitry is needed to select the fuse to be blown as well as two voltage sources and a current source connected to the preexisting circuit to provide the voltage and current sufficient to blow the fuse. Thus there exists a need for a scheme which would minimize the amount of circuitry needed in addition to the output circuit to blow the fusible element in the memory matrix and which requires a minimum amount of additional sources of current or voltage.

SUMMARY OF THE INVENTION

A simplified output circuit for read only memories (ROM's and PROM's) is provided which uses the inherent current of the storage matrix through the selected location to provide the output voltage level signal which is compatible with TTL voltage levels and loading requirements. The output circuit includes an output switch which may be a transistor having its base connected to the output of the storage matrix and a current steering circuit which may include a transistor having its collector connected to the base of the output transistor switch. The transistor of the current steering circuit directs the storage matrix current towards or away from the base of the output transistor switch depending on the magnitude of the current.

The output transistor switch and the current steering transistor are both bipolar Schottky transistors for quick switching. An enable switch which interconnects the storage matrix and the output circuit may be a transistor whose base receives the enable signal and whose collector-emitter circuit interconnects the output of the storage matrix to the junction between the base of the output transistor and the collector of the current steering transistor.

A circuit or scheme for programming a read only memory having fusible elements therein includes a fusing circuit which includes a transistor functioning as a current sink, having its base connected to the output of the output circuit and its collector connected to the output of the storage matrix. The current sink transistor is in parallel across the output circuit previously described which includes the output transistor, the current steering transistor and the enable switch. A first voltage level applied to the output terminal biases the current sink transistor on. The collector bias of the bipolar memory storage matrix is increased to a second voltage level above the normal operating level for reading. The voltage level across the selected fusible element, using the standard selection input circuits, and current into the current sink transistor is sufficient to cause an open circuit for disintegration of the fuse in the collector-emitter path of the selected bipolar transistor storage matrix location. The enable switch transistor is off to protect the output circuit.

OBJECTS OF THE INVENTION

Object of the present invention is to provide an output circuit which responds quicker than prior art output circuits.

Another object of the invention is to provide a simplified output circuit using active elements to thereby reduce power dissipation and response time.

A further object of the invention is the provision of a current steering mechanism so as to use the inherent current through the selected location to drive the output switch.

Still another object of the invention is to provide a fusing circuit with a minimum number of elements in addition to those of the storage matrix and output circuit.

An even further object of the invention is to provide an output circuit using an enable switch to isolate the output circuit during programming by fuse disintegration.

Another object is to provide a programming scheme having a low impedance path and using relatively low voltages.

Other objects, advantages and novel features of the present invention will become apparent from the following detailed description of the invention when considered in conjunction with the accompanying drawings.

BRIEF DESCRIPTION OF THE DRAWINGS

The FIGURE is a schematic of a memory system employing the simplified output and fusing circuit of the present invention.

DESCRIPTION OF THE PREFERRED EMBODIMENTS

A memory system 10 is illustrated as including a storage matrix 12 having a row decoder 14, a column decoder 16, an output circuit 18 and a chip enable 20. The circuits of row and column decoder 14 and 16 and chip enable 20 are well-known and thus are illustrated only by block diagrams. The storage matrix 12 is illustrated as a programmable read only memory having a plurality of bipolar transistors with a fusible element in their emitter circuits. As is well-known, all the bases of the transistors in a single row are connected to a common output of the row decoder 14. The base of transistors 22 and 24 of the first row are connected and the last row having transistors 28 and 30 have their bases connected in common to the last output 32 of row decoder 14.

Also, as is well-known, the emitters of transistors in a single column are connected in common to one of the outputs of the column decoder 16. The emitters of transistor 22 and 28 of the first column are connected through fusible elements 34 and 36 respectively to a column transistor switch 38 which is connected to the first output 40 of column decoder 16. Note that fusible element 36 is shown as blown or an open circuit. The last column including transistors 24 and 30 are connected through fusible elements 42 and 44 in their respective emitter circuit to a column transistor switch 46 which is connected to the last output 48 of column decoder 16. The emitters of the plural column decoder transistor switch including transistors 38 and 46 are connected to a common output line or terminal 50. By having the fusible elements in the emitter circuit and a common collector for the isolating transistors, additional matrix array isolation is not required.

If, for example, the memory storage matrix 12 includes sixty-four rows and sixty-four columns, the row decoder 14 could be a one of sixty-four decoder having sixty-four outputs and column decoder 16 could likewise be a one of sixty-four decoder. Alternatively, column decoder 16 may be four identical one of sixteen decoders wherein four separate output terminals may be provided for each of the group of sixteen commonly tied emitter outputs of the transistor switches for each of the separate decoders. Four separate output circuits 18 may be provided for the four separate groups of decoders.

The common output terminal 50 of the storage matrix 12 is connected to the output circuit 18 by an enable switch illustrated as transistor 52. The chip enable 20 is connected to the base of an enable transistor 52 and controls transistor 52 so as to permit or inhibit flow of the emitter current from the selected location of the storage matrix 12 into the output circuit 18. A biasing resistor 54 is connected between the output terminal 50 of the storage matrix 12 and the base of transistor 52.

The emitter of enable transistor 52 is connected to a junction 56 to which is connected the base of output switch illustrated as transistor 58. The output terminal 60 of the output circuit 18 is connected to the collector of output transistor 58. Also connected to junction 56 is a current steering circuit including current steering transistor 62 whose base is connected to a biasing circuit which includes transistor 64, resistor 66, and transistors 68 and 70. The current steering circuit monitors current at junction 56 from the output 50 of the storage matrix 12 to direct current towards or away from the base of output transistor 58. By monitoring and steering the current, transistor 62 causes the output transistor 58 to have distinct switching states to produce distinct output voltages representing a logic 1 or a logic 0 at voltage levels compatible to TTL.

Also included in the output circuit 18 is a fusing circuit connected in parallel with the previously described output circuit between the output terminal 50 of the storage matrix 12 and the output terminal 60 of the output circuit 18. The fusing circuit includes the transistor 72 having its base connected to output terminal 60 through zener diode 74 and resistor 76. The collector of transistor 72 is connected to the storage matrix output 50 through a diode 78 and the emitter is grounded. The diode 78 and transistor 72 provide a low impedance current sink for the fusing current through the selected fusible element in the storage matrix 12. By connecting the fusing circuit across the output terminals 50 and 60 respectively and biasing enable transistor 52 off, the fusing current does not travel through the remainder of the output circuit and thus reduces the impedance in the fusing path.

As is evident from the FIGURE, transistor 38, 46, 58, 62, and 64 are bipolar Schottky diode transistors. These transistors are used because of their quick switching response time so as to reduce the overall response time of the memory.

OPERATION

The biasing circuit of output circuit 18 provides a current of 2.6 milliamperes through resistor 66. This assumes that the $V_{CC}$ is 5 volts, $V_{BE} = 0.8$ volts for transistors 64, 68, and 70, and resistor 66 equals 1,000 ohms. The division of the current through resistor 66 into the collector and base of transistor 64 and the base of transistor 62 will depend upon the collector current available to transistor 62. Assuming that transistor 62 and 64 are of equal geometry, then the emitter currents of transistors 62 and 64 must be equal.

Assuming first that storage matrix location 36 is selected, wherein the fusible element has been blown or destroyed, the collector current of transistor 38 is zero. The bias current from the column decoder 16 via line 40 to the base of transistor 38 produces an emitter current to the output terminal 50. The chip enable 24 allows the current at terminal 50 to forward bias transistor 52 thereby transmitting the emitter current at the output terminal 50 to the junction 56. For purposes of example, the emitter current from transistor 52 appearing at junction 56 has been measured to be 1.41 milliamperes.

As stated previously, the emitter current for transistor 62 and 64, if they are of the same geometry, must be equal. Thus the emitter current for each of these transistors is equal to the sum of the collector current of transistor 62, received from junction 56, and the biasing current flowing through resistor 66 divided by two. In the present example, with the collector current of transistor 62 being 1.41 milliamperes and the biasing current through resistor 66 being 2.6 milliamperes, the emitter current through each emitter of transistors 62 and 64 is equal to approximately 2 milliamperes. Since the emitter current of transistor 62 is 2 milliamperes and its collector current is 1.41 milliamperes, the base current of transistor 62 is 0.59 milliamperes. Consequently, transistor 62 is saturated. With the steering transistor 62 saturated, it draws all the current from junction 56 and the output transistor 58 is off. Assuming that a resistor pullup has been connected from the output terminal 60 to a $V_{CC}$ of 5 volts, the output voltage at terminal 60 would be 5 volts, and would represent, for example, a logic 1 state.

For a second example, it is assumed that matrix storage location 42 is selected where the fusible element is not blown or destroyed. The row decoder 14 provides voltage and current on line 26 to forward bias transistor 24 causing emitter current to flow through fusible element 42 into the collector of transistor 46. Column decoder 16 provides a current and voltage on line 48 to forward bias transistor 46 allowing the emitter current through fusible element 42 to appear as an emitter current at the output terminal 50 of the memory storage matrix 12. The chip enable circuit 20 allows the current at output terminal 50 to forward bias transistor 52 so as to transmit the current at the base as well as the collector of transistor 52 through its emitter to junction 56. The current at junction 56, which has been measured to be 5.3 1 milliamperes, is monitored by steering transistor 62 which has a maximum collector current of 2.5 milliamperes. Thus with a current of 5.3 milliamperes at junction 56, 2.5 milliamperes of which is flowing through the collector of transistor 62, the base current of transistor 58 is 2.8 milliamperes. Thus the output transistor 58, being forward biased and on, provides at output 60 a voltage of approximately 0.2 volts, which represents a logic 0.

The unique fusing circuit which is part of output circuit 18 includes transistor 72, zener diode 74, resistor 76 and diode 78. To provide the fusing function, the chip enable 20 provides a voltage such that switch 52 is cut off to prevent any of the fusing current and voltages to be applied to the output transistor 58 and the steering transistor 62. To destroy, blow, or otherwise form an open circuit in the fusible elements of the storage matrix 12, a voltage, for example 10 volts is applied to the output terminal 60. This voltage through zener diode 74 and resistor 76 forward biases transistor 72. The sum of the voltage across diode 78 and the collector to emitter voltage across transistor 72 pulls down the output terminal 50 of the storage matrix 12 to 1.1 volts. The collector voltage $V_{CC}$ for the transistors in the storage matrix 12 is raised from the normal 5 volts to, for example 12 volts.

The location in the storage matrix of the fusible element to be destroyed or opened is determined by the row decoder 14 and column decoder 16. For example, to destroy fusible element 44, row decoder 14 applies a voltage on line 32 to forward bias transistor 30 and column decoder 16 provides a voltage on line 48 to forward bias transistor switch 46. Thus collector-emitter current paths are created between the 12 volts of $V_{CC}$ and the 1.1 volts att storage matrix output terminal 50. Taking into account the voltage drop across transistors 30 and 46, the voltage appearing across the fusible element 44 is approximately 6 volts. If fusible element 44 is a 300 ohm resistor, a current of 20 milliamperes flows through fusible element 44. This current is sufficient to blow or destroy the fusible element, causing an open circuit.

Thus it can be seen that the fusing circuit uses a low impedance current sink comprising transistor 72 and diode 78, applies a voltage at the output and increases the bias for the collectors of the bipolar storage matrix transistors to create sufficient voltage across and current through a selected fusible element. The fusing path through the bipolar storage matrix is identical to the READ path which allows parallel fusing. By increasing $V_{CC}$ in the emitter follower array, fusing power is uniform, regardless of topological position of the bits. Also the enabling transistor 52 protects the remainder of the output circuit including the output transistor 58 and the steering transistor 62 from the voltage and current path of the fusing operation.

From the preceding description of the preferred embodiment, it is evident that the objects of the invention are obtained. An output circuit is provided which monitors the inherent collector-emitter current through the memory storage matrix. Similarly, the output circuit includes a steering circuit which steers the collector-emitter current of the storage matrix to or from an output or from an output transistor switch which provide TTL compatible output voltages. Similarly, a output circuit enable switch is used to interrupt the collector-emitter current flow from the storage matrix to the output circuit during undesirable times — for example, during the destructions of selected fusible elements. A fusing circuit and technique is also shown which is connected in parallel with the current steering and output transistor switch. Although the invention has been described and illustrated in detail, it is to be clearly understood that the same is by way of illustration and example only and is not to be taken by way of limitation. The spirit and scope of the invention is to be limited only by the terms of the appended claims.

What is claimed is:

1. In a memory having a storage matrix of a plurality of rows and a plurality of columns, an input means for selecting a storage location in said storage matrix by row and column and an output means for providing a voltage output representing a logic one or zero stored at said selected storage location, the improvement being said output means which comprises:
    output switch means for providing a logic one or zero output and having an input;
    current steering means connected to the output of said storage matrix and said input of said output switch means for controlling the output of said output switch means by steering the current from said storage matrix towards or away from said input of said output switch means; and
    an enable switch means connected between said output of said storage matrix and a junction of said input to said output switch means and said current steering means for inhibiting or enabling storage matrix current to enter said junction.

2. In a memory having a storage matrix of a plurality of rows and a plurality of columns of bipolar transistors, an input means for selecting a storage location in said storage matrix by row and column and an output means for providing a voltage output representing a logic one or zero stored at said selected storage location, the improvement being said output means which comprises:
    an output bipolar transistor having its base connected to an emitter of the plurality of serially connected collector-emitter current path through a selected storage location for providing a logic one or zero output; and
    current steering means connected to the base of said output transistor for controlling the output of said output transistor by steering the current from said selected storage location towards or away from the base of said output transistor.

3. A memory output circuit comprising active output switch means having an input terminal to connect said output switch means in series with a memory and its power terminals, to receive current from the selected location in a memory and having an output switching between two voltages as determined by the magnitude of said input current, and current steering means connected to said input terminal for producing distinct switching states of said switch means by steering said input current toward or away from said input terminal of said switch means.

4. The memory output circuit of claim 3 wherein said active output switch means comprises a first bipolar transistor having its base as said input terminal and the output being across its collector and emitter.

5. A memory output circuit comprising an input terminal, a first bipolar transistor output switch having a base to receive current from a selected location in a memory and having an output switching between two voltages as determined by the magnitude of said input current, and an enable switch means having an enable input and connected between said input terminal and said base of said first bipolar transistor for interconnecting said input terminal and said base of said first bipolar transistor in response to an enable signal on said enable input.

6. The memory output circuit of claim 5 wherein said enable switch means comprises a second bipolar transistor having its collector-emitter path connected between said input terminal and said base of said first bipolar transistor and its base being said enable input.

7. A memory output circuit comprising a first bipolar transistor output switch having its base as an input terminal to receive current from a selected location in a memory and having an output switching between two voltages as determined by the magnitude of said input current, and current steering means connected to the base of said first bipolar transistor for producing distinct switching states of said first bipolar transistor by steering said input current toward or away from said base of said first transistor.

8. The memory output ciruitry of claim 7 wherein said current steering means includes a second bipolar transistor having its collector connected to said base of said first bipolar transistor and its base connected to a biasing source.

9. The memory output circuit of claim 8 wherein said first and second bipolar transistors are each bipolar Schottky transistors.

10. In a memory having a storage matrix of a plurality of rows and a plurality of columns, power supply terminals, an input means for selecting a storage location in said storage matrix by row and column and an output means for providing a voltage output representing a logic one or zero stored at said selected storage location, the improvement being said output means which comprises:
Output switch means, in series with said storage matrix and said power supply terminals, having an input connected to an output terminal of said storage matrix and switching between two states for providing a logic one or zero output; and
current steering means connected to said output terminal of said storage matrix and said input of said output switch means for controlling the switching states of said output switch means by steering the current from said storage matrix towards or away from said input of said output switch means.

11. The memory of claim 10 wherein said storage matrix includes bipolar transistors, and said output terminal is an emitter of the plural serially connected collector-emitter current path through said selected location.

12. The memory of claim 10 wherein said storage matrix is a read only memory having a bipolar transistor at each storage location, the collector-emitter path of each bipolar transistor being in series with said output terminal through a storage location.

13. The memory of claim 10 wherein said output means includes a bipolar transistor having its collector to emitter path connected between said output terminal and a junction of said input to said output switch means and said current steering means and having its base connected to an enable input for enabling or inhibiting the storage matrix current to enter said junction.

14. The memory of claim 13 wherein said output switch means comprises a bipolar transistor having its base as said input connected to said junction and the output being across its collector-emitter.

15. The memory of claim 14 wherein said current steering means includes a bipolar transistor having its collector connected to said junction and a biasing circuit connected to its base.

16. The memory of claim 15 wherein said bipolar transistor of said output switch means and of said current steering means are bipolar Schottky transistors.

17. In a programmable read only memory having a storage matrix of a plurality of rows and columns, an input means for selecting a storage location in said matrix by row and column and an output means for providing a voltage output representing a logic one or zero stored at said selected storage location, the improvement being said output means which comprises:
current sink means connected between an output terminal of said output means and an output terminal of said storage matrix for developing sufficient current through a selected storage location with a first voltage applied to the output terminal of said output means and a second voltage applied to the bias of the storage matrix, which is greater than the normal bias voltage, to cause an open circuit at said selected location; and
an enable switch means connected between said output terminal of said storage matrix and the input to said output means for selectively inhibiting storage matrix current from entering said output means.

18. In a programmable read only memory having a storage matrix of a plurality of rows and columns, an input means for selecting a storage location in said matrix by row and column and an output means for providing a voltage output representing a logic one or zero stored at said selected storage location, the improvement being said output means which comprises:
current sink means including a transistor having its base connected to an output terminal of said output means and its collector connected to an output terminal of said matrix for developing sufficient current through a selected storage location with a first voltage applied to the output terminal of said output means and a second voltage applied to the bias of the storage matrix, which is greater than the normal bias voltage, to cause an open circuit at said selected location.

19. The programmable read only memory of claim 18 wherein said current sink means further includes a zener diode and resistor connected in series between said base of said transistor and said output terminal of said output means.

20. The programmable read only memory of claim 18 wherein said storage matrix includes a plurality of bipolar transistors having fusible elements in series with their collector-emitter path between said bias and said output terminal of said storage matrix.

* * * * *